(12) United States Patent
Tachibana et al.

(10) Patent No.: US 11,985,762 B2
(45) Date of Patent: May 14, 2024

(54) FLEXIBLE LAMINATED BOARD AND MULTILAYER CIRCUIT BOARD

(71) Applicant: UBE EXSYMO CO., LTD., Tokyo (JP)

(72) Inventors: Eisuke Tachibana, Tokyo (JP); Taro Suzuki, Tokyo (JP); Makoto Totani, Kariya (JP); Kouji Kondoh, Kariya (JP); Eijirou Miyagawa, Kariya (JP); Junya Kasahara, Tokyo (JP); Takao Arima, Tokyo (JP)

(73) Assignee: UBE EXSYMO CO., LTD., Tokyo (JP)

( * ) Notice: Subject to any disclaimer, the term of this patent is extended or adjusted under 35 U.S.C. 154(b) by 95 days.

(21) Appl. No.: 17/157,695

(22) Filed: Jan. 25, 2021

(65) Prior Publication Data
US 2021/0153348 A1    May 20, 2021

Related U.S. Application Data

(62) Division of application No. 15/541,630, filed as application No. PCT/JP2016/050709 on Jan. 12, 2016, now abandoned.

(30) Foreign Application Priority Data

Jan. 13, 2015 (JP) .................................. 2015-004337
Jan. 13, 2015 (JP) .................................. 2015-004338

(51) Int. Cl.
*B32B 15/08* (2006.01)
*B29C 43/48* (2006.01)
(Continued)

(52) U.S. Cl.
CPC ....... *H05K 1/0393* (2013.01); *B29C 48/9145* (2019.02); *B32B 3/08* (2013.01);
(Continued)

(58) Field of Classification Search
CPC ........ H05K 1/0393; H05K 1/09; H05K 1/115; H05K 3/022; H05K 3/4655; H05K 3/067;
(Continued)

(56) References Cited

U.S. PATENT DOCUMENTS 4,909,886 A * 3/1990 Noguchi ................. B32B 15/20
156/286
5,529,740 A * 6/1996 Jester ..................... B29C 71/02
264/317

(Continued)

FOREIGN PATENT DOCUMENTS

EP    3287260 A1    2/2018
JP    H0542603 A    2/1993
(Continued)

OTHER PUBLICATIONS

JP2009071021-A Machine Translation of Description (Google and EPO) (Year: 2021).*
(Continued)

*Primary Examiner* — Cynthia L Schaller
(74) *Attorney, Agent, or Firm* — J. Miguel Hernandez; James R. Gourley; Carstens, Allen & Gourley, LLP

(57) ABSTRACT

A flexible laminated sheet manufacturing method includes thermocompression-bonding an insulation film formed of a liquid crystal polymer onto a metal foil between endless belts to form a flexible laminated sheet. The thermocompression bonding includes heating the flexible laminated sheet so that the maximum temperature of the sheet is in the range from a temperature that is 45° C. lower than the melting point of the liquid crystal polymer to a temperature that is 5° C. lower than the melting point. The thermocompression bonding also includes slowly cooling the flexible laminated sheet so that an exit temperature, which is a temperature of the sheet when transferred out of the endless belts, is in the range from a temperature that is 235° C. lower (Continued)

than the melting point of the liquid crystal polymer to a temperature that is 100° C. lower than the melting point.

4 Claims, 2 Drawing Sheets

(51) Int. Cl.
| | |
|---|---|
| B29C 48/88 | (2019.01) |
| B32B 3/08 | (2006.01) |
| B32B 7/04 | (2019.01) |
| B32B 7/06 | (2019.01) |
| B32B 15/088 | (2006.01) |
| B32B 15/09 | (2006.01) |
| B32B 15/098 | (2006.01) |
| B32B 15/18 | (2006.01) |
| B32B 15/20 | (2006.01) |
| B32B 27/28 | (2006.01) |
| B32B 27/36 | (2006.01) |
| B32B 27/42 | (2006.01) |
| B32B 37/06 | (2006.01) |
| B32B 37/08 | (2006.01) |
| B32B 37/10 | (2006.01) |
| H05K 1/03 | (2006.01) |
| H05K 1/09 | (2006.01) |
| H05K 1/11 | (2006.01) |
| H05K 3/02 | (2006.01) |
| H05K 3/46 | (2006.01) |
| B65G 15/12 | (2006.01) |
| H05K 3/06 | (2006.01) |
| H05K 3/22 | (2006.01) |

(52) U.S. Cl.
CPC ............... *B32B 7/04* (2013.01); *B32B 7/06* (2013.01); *B32B 15/08* (2013.01); *B32B 15/088* (2013.01); *B32B 15/09* (2013.01); *B32B 15/098* (2013.01); *B32B 15/18* (2013.01); *B32B 15/20* (2013.01); *B32B 27/28* (2013.01); *B32B 27/281* (2013.01); *B32B 27/283* (2013.01); *B32B 27/36* (2013.01); *B32B 27/42* (2013.01); *B32B 37/06* (2013.01); *B32B 37/08* (2013.01); *B32B 37/10* (2013.01); *B32B 37/1027* (2013.01); *H05K 1/09* (2013.01); *H05K 1/115* (2013.01); *H05K 3/022* (2013.01); *H05K 3/4655* (2013.01); *B29C 43/48* (2013.01); *B32B 2250/02* (2013.01); *B32B 2250/03* (2013.01); *B32B 2250/40* (2013.01); *B32B 2307/30* (2013.01); *B32B 2307/302* (2013.01); *B32B 2307/306* (2013.01); *B32B 2307/50* (2013.01); *B32B 2307/538* (2013.01); *B32B 2307/546* (2013.01); *B32B 2307/732* (2013.01); *B32B 2307/734* (2013.01); *B32B 2307/748* (2013.01); *B32B 2309/02* (2013.01); *B32B 2309/04* (2013.01); *B32B 2405/00* (2013.01); *B32B 2457/08* (2013.01); *B32B 2457/20* (2013.01); *B65G 15/12* (2013.01); *H05K 3/067* (2013.01); *H05K 3/227* (2013.01); *H05K 2201/0141* (2013.01); *H05K 2201/0191* (2013.01); *H05K 2201/068* (2013.01); *H05K 2203/066* (2013.01); *H05K 2203/1194* (2013.01); *H05K 2203/1545* (2013.01)

(58) Field of Classification Search
CPC .......... H05K 3/227; H05K 2201/0141; H05K 2201/0191; H05K 2201/068; H05K 2203/066; H05K 2203/1194; H05K 2203/1545; H05K 1/03; B29C 48/9145; B29C 43/48; B32B 3/08; B32B 7/04; B32B 7/06; B32B 15/08; B32B 15/088; B32B 15/09; B32B 15/098; B32B 15/18; B32B 15/20; B32B 27/28; B32B 27/281; B32B 27/283; B32B 27/36; B32B 27/42; B32B 37/06; B32B 37/08; B32B 37/10; B32B 37/1027; B32B 2250/02; B32B 2250/03; B32B 2250/40; B32B 2307/30; B32B 2307/302; B32B 2307/306; B32B 2307/50; B32B 2307/538; B32B 2307/546; B32B 2307/732; B32B 2307/734; B32B 2307/748; B32B 2309/02; B32B 2309/04; B32B 2405/00; B32B 2457/08; B32B 2457/20; B32B 7/02; B32B 2305/55; B32B 2307/206; B32B 2309/12; B65G 15/12
See application file for complete search history.

(56) References Cited

U.S. PATENT DOCUMENTS

| | | | |
|---|---|---|---|
| 6,616,796 B1 | 9/2003 | Onodera et al. | |
| 2002/0074158 A1* | 6/2002 | St. Lawrence | H05K 3/4655 |
| | | | 428/209 |
| 2005/0067739 A1 | 3/2005 | Onodera et al. | |
| 2006/0151106 A1* | 7/2006 | Hiraishi | B32B 37/0053 |
| | | | 156/309.6 |
| 2011/0120754 A1 | 5/2011 | Kondo et al. | |
| 2014/0231123 A1 | 8/2014 | Onodera et al. | |
| 2017/0238428 A1* | 8/2017 | Takahashi | H05K 1/0393 |
| | | | 174/251 |

FOREIGN PATENT DOCUMENTS

| | | | | |
|---|---|---|---|---|
| JP | 200190424 | A | * | 7/2000 |
| JP | 2000263577 | A | | 9/2000 |
| JP | 2000343610 | A | | 12/2000 |
| JP | 2003023250 | A | | 1/2003 |
| JP | 2005105165 | A | | 4/2005 |
| JP | 2009071021 | A | * | 4/2009 |
| JP | 2014060449 | A | | 4/2014 |
| JP | 2014128913 | A | | 7/2014 |
| JP | 2014233891 | A | | 12/2014 |
| WO | 2015050080 | A1 | | 4/2015 |

OTHER PUBLICATIONS

Kitagawa Elaborate Mach, JP200190424A Machine Translation of Description (Year: 2023).*

Hong, et al., "Effect of Annealing on the Physical Properties of Biaxially Oriented Liquid Crystalline Copolyester Films," Macromolecules 1995, 28, 6481-6487 (7 pages).

* cited by examiner

FLEXIBLE LAMINATED BOARD AND MULTILAYER CIRCUIT BOARD

CROSS-REFERENCE TO RELATED APPLICATIONS

This application is a divisional application of co-pending U.S. application Ser. No. 15/541,630 filed on Jul. 5, 2017 entitled "Flexible Laminated Board and Multilayer Circuit Board," which is a US 371 application from PCT/JP2016/050709 filed Jan. 12, 2016, which claims priority to Japanese Patent Application No. 2015-004337 filed Jan. 13, 2015, and to Japanese Patent Application No. 2015-004338 filed Jan. 13, 2015, the technical disclosures of which are hereby incorporated herein by reference.

TECHNICAL FIELD

The present invention relates to a flexible laminated sheet and a multilayer circuit board.

BACKGROUND ART

A flexible laminated sheet in which an insulation layer and a metal layer are bonded together is used as, for example, a material for manufacturing a flexible printed wiring board. A flexible laminated sheet that uses a liquid crystal polymer, which is a low-dielectric material, in an insulation layer is drawing attention because there is a need to increase the frequency of the flexible printed wiring board.

For example, patent document 1 discloses a technique in which a double belt press device is used to place a metal foil on each surface of an insulation film formed of a liquid crystal polymer and then thermocompression-molding the metal foils and the insulation film to manufacture a flexible laminated sheet in which the insulation film and the metal foils have been thermocompression-bonded together. Further, patent document 1 discloses that the occurrence of dimensional distortion or the like can be reduced in the manufactured flexible laminated sheet while maintaining the peel strength between the insulation layer and the metal foils by setting the heating temperature during the thermocompression molding to the range from a temperature that is equal to the melting point of the liquid crystal polymer of the insulation film to a temperature that is 20° C. higher than the same melting point.

Patent document 2 discloses a method for manufacturing a multilayer circuit board that includes laminating a plurality of pattern films each including an insulation film formed of a thermoplastic resin and a conductor pattern formed in the surface of the insulation film and integrally bonding the pattern films with a heating press into a multilayer. In the pattern film used for manufacturing the multilayer circuit board, an insulation layer formed of the insulation film includes a via hole, and the via hole is filled with an interlayer connection material. The interlayer connection material, with which the via hole is filled, ensures conduction between the layers in the multilayer circuit board.

PRIOR ART DOCUMENTS

Patent Documents

Patent Document 1: Japanese Laid-Open Patent Publication No. 2010-221694
Patent Document 2: Japanese Laid-Open Patent Publication No. 2003-23250

SUMMARY OF THE INVENTION

Problems that are to be Solved by the Invention

The progress in technology for increasing the mounting density on a flexible printed wiring board has resulted in the need for a flexible laminated sheet having a small dimensional change rate. More specifically, there is a need for a flexible laminated sheet having a small dimensional change rate between before and after forming a conductor circuit and between before and after a heating process that performs reflow-soldering to mount various elements.

When manufacturing multilayer circuit boards in each of which pattern films are used that each include an insulation film formed of a different liquid crystal polymer, conduction failures between the layers of each multilayer circuit board occurs more often when using an insulation film formed of a type II liquid crystal polymer than when using an insulation film formed of a type I liquid crystal polymer. This may be because conduction between the layers through the interlayer connection material is interrupted by the softened liquid crystal polymer that flows into the via hole when integrating the pattern films with the heating press.

The present invention is made in view of such circumstances, and its objective is to provide a flexible laminated sheet having a small dimensional change rate. It is another objective of the present invention to provide a method for manufacturing a laminated sheet that uses an insulation film formed of a type II liquid crystal polymer and reduces, when forming a multilayer circuit board, conduction failures between the layers and to provide a multilayer circuit board that reduces conduction failures between the layers.

Means for Solving the Problems

To achieve the above objectives and in accordance with one aspect of the present invention, a flexible laminated sheet is provided that includes an insulation layer formed of a liquid crystal polymer and a metal layer formed on one surface or each of both surfaces of the insulation layer. The liquid crystal polymer has a melting point in excess of 250° C. The flexible laminated sheet has a dimensional change rate in the range of ±0.05% when a heating temperature is 250° C. in a dimensional stability test defined in Japanese Industrial Standards JIS C 6471. The insulation layer has a standard deviation of thickness of less than or equal to 1.2 μm in a widthwise direction of the insulation layer.

To achieve the above objectives and in accordance with another aspect of the present invention, a method for manufacturing a flexible laminated sheet is provided that includes a step of continuously feeding an insulation film formed of a liquid crystal polymer and a metal foil between a pair of two endless belts and a step of thermocompression-bonding the insulation film onto the metal foil between the endless belts to form a flexible laminated sheet. The step of thermocompression bonding includes heating the flexible laminated sheet so that the maximum temperature of the flexible laminated sheet is in the range from a temperature that is 45° C. lower than the melting point of the liquid crystal polymer of the insulation film to a temperature that is 5° C. lower than the same melting point. The step of thermocompression bonding also includes slowly cooling the flexible laminated sheet so that an exit temperature, which is a temperature of the flexible laminated sheet when transferred out of the endless belts, is in the range from a temperature that is 235° C. lower than the melting point of the liquid crystal polymer of the insulation film to a temperature that is 100° C. lower than the same melting point.

In the method for manufacturing a flexible laminated sheet, it is preferred that the insulation film be formed of a liquid crystal polymer containing as constituent units 6-hydroxy-2-naphthoic acid and para-hydroxybenzoic acid and having a melting point in excess of 250° C.

In the method for manufacturing a flexible laminated sheet, it is preferred that the metal foil be at least one selected from the group consisting of a copper foil, an aluminum foil, a stainless steel foil, and a foil formed of an alloy of copper and aluminum.

To achieve the above objectives and in accordance with a further aspect of the present invention, a method for manufacturing a laminated sheet is provided that is formed by laminating an insulation film formed of a polymer of 6-hydroxy-2-naphthoic acid and 4-hydroxybenzoic acid and a metal foil together and used to manufacture a multilayer circuit board. The method includes a step of drying the insulation film by heating the insulation film at a temperature of 120° C. to 250° C. for 20 seconds or longer and a step of thermocompression-bonding the dried insulation film onto the metal foil to form a laminated sheet by pressing the dried insulation film and the metal foil against each other with a pressure of 0.5 MPa to 10 MPa for 10 seconds to 600 seconds while heating the dried insulation film and the metal foil at a temperature of 250° C. to 330° C. The insulation film obtained by removing the metal foil from the laminated sheet after the step of thermocompression bonding has a maximum deformation rate of less than or equal to 0.85% at 250° C. to 300° C. measured with a dynamic viscoelasticity measurement device under the conditions in which the dynamic load is 15 g, the frequency is 1 Hz, and the rate of temperature increase is 5° C./min while controlling the dynamic stress and the static load in a dynamic stress control mode and an automatic static load mode.

To achieve the above objectives and in accordance with a still another aspect of the present invention, a multilayer circuit board is provided that is formed by laminating a plurality of pattern films into a multilayer. Each pattern film is formed by circuit-processing the laminated sheet obtained through the method for manufacturing a laminated sheet. The insulation film contained in each of the pattern films includes a via hole filled with an interlayer connection material.

Effects of the Invention

The present invention succeeds in providing a flexible laminated sheet having a small dimensional change rate. Further, the present invention succeeds in reducing conduction failures between the layers of a multilayer circuit board.

MODES FOR CARRYING OUT THE INVENTION

First Embodiment

One embodiment of a flexible laminated sheet manufacturing method of the present invention will now be described in detail with reference to FIG. 1.

A method for manufacturing a flexible laminated sheet 10 of the present embodiment includes a thermocompression bonding step of continuously thermocompression-bonding a metal foil 12 onto each surface of an insulation film 11. The flexible laminated sheet 10 is manufactured through the thermocompression bonding step.

First, the insulation film 11 and the metal foils 12 used for manufacturing the flexible laminated sheet 10 will be described.

The insulation film 11 forms an insulation layer of the flexible laminated sheet 10. The insulation film 11 is formed of a liquid crystal polymer having a melting point in excess of 250° C. Examples of such a liquid crystal polymer include a liquid crystal polymer containing as constituent units ethylene terephthalate and para-hydroxybenzoic acid, a liquid crystal polymer containing as constituent units phenol, phthalic acid, and para-hydroxybenzoic acid, and a liquid crystal polymer containing as constituent units 6-hydroxy-2-naphthoic acid and para-hydroxybenzoic acid.

The thickness of the insulation film 11 is not particularly limited. However, the thickness of the insulation film 11 is preferably in the range from 6 μm to 300 μm, more preferably in the range from 12 μm to 150 μm, and further preferably in the range from 25 μm to 100 μm.

The metal foil 12 forms a metal layer of the flexible laminated sheet 10. A metal foil such as a copper foil, an aluminum foil, a stainless steel foil, and a foil formed of an alloy of copper and aluminum can be used as the metal foil 12. In particular, it is preferred that at least one selected from a rolled copper foil, an electrolytic copper foil, and an aluminum foil be used as the metal foil 12.

The surface roughness of the metal foil 12 is not particularly limited. However, the ten point height of roughness profile (Rz) of the metal foil 12 is preferably in the range from 0.5 μm to 10 μm and more preferably in the range from 0.5 μm to 7 μm. The thickness of the metal foil 12 is not particularly limited. However, the thickness of the metal foil 12 is preferably in the range from 1.5 μm to 150 μm, more preferably in the range from 2 μm to 70 μm, and further preferably in the range from 9 μm to 35 μm.

Next, the thermocompression bonding step of the manufacturing method of the present embodiment will be described.

Figure 1:
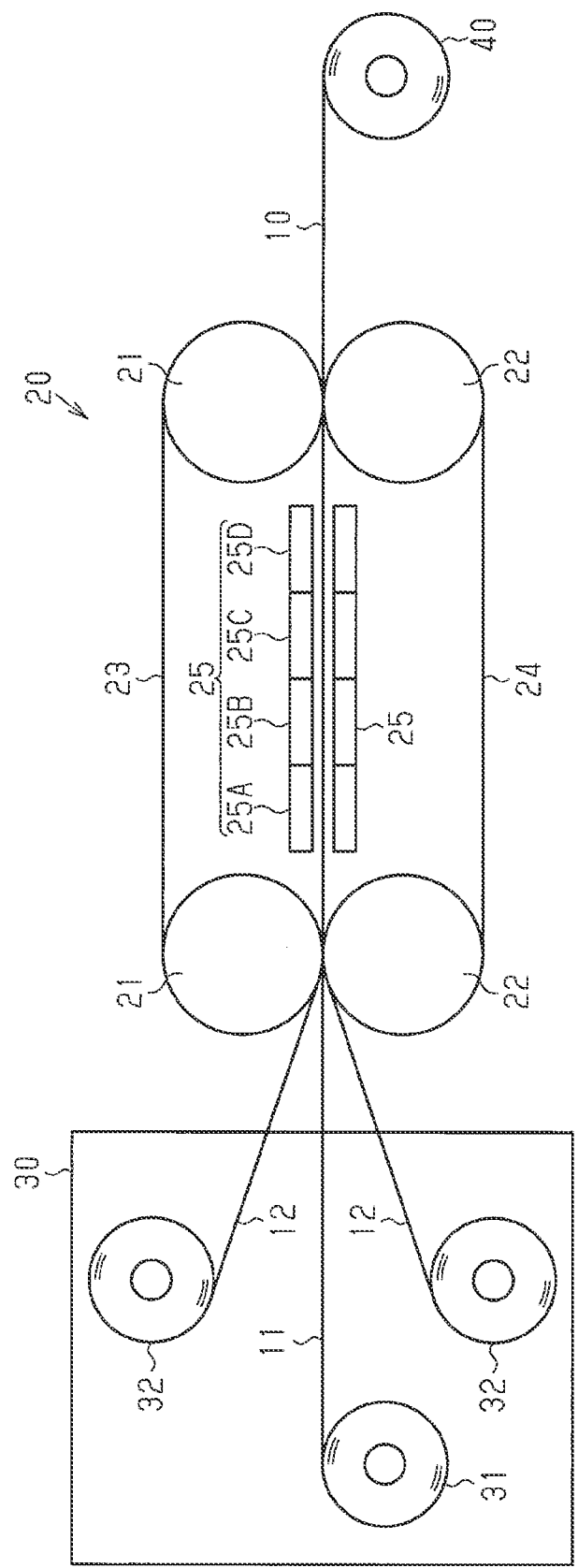
FIG. 1 is a schematic view showing a thermocompression bonding step according to one embodiment of the present invention.

As shown in FIG. 1, the thermocompression bonding step is performed on a production line including a double belt press device 20, a feeding unit 30 that feeds the insulation film 11 and the metal foils 12 to the double belt press device 20, and a winding unit 40 that winds the flexible laminated sheet 10 transferred out of the double belt press device 20.

The double belt press device 20 includes a pair of upper drums 21, which are spaced apart from each other by a predetermined distance in a transfer direction, and a pair of lower drums 22, which are located below the upper drums 21 and also spaced apart from each other by a predetermined distance in the transfer direction. An endless belt 23 runs around the pair of upper drums 21. The endless belt 23 is configured to rotate when the pair of upper drums 21 rotate. In the same manner, an endless belt 24 runs around the pair of lower drums 22. The endless belt 24 is configured to rotate when the pair of lower drums 22 rotate. The endless belts 23 and 24 are formed of, for example, a metal material such as stainless steel, copper alloy, or aluminum alloy.

A thermocompression device 25 is provided inside each of the endless belts 23 and 24. The thermocompression devices 25 are arranged one upon the other sandwiching the endless belts 23 and 24. The thermocompression devices 25 apply a predetermined pressure to portions of the endless belts 23 and 24 located between the thermocompression devices 25 and heat the portions. The thermocompression devices 25 are configured to be capable of adjusting the heating temperature of each of predetermined ranges in the transfer direction. For example, for the thermocompression devices 25 shown in FIG. 1, the heating temperature of each of four portions 25A to 25D, which are arranged in the transfer direction, is adjusted individually.

The feeding unit 30 includes an insulation film roll 31 in which the elongated insulation film 11 is wound into a roll and a set of metal foil rolls 32 in which the elongated metal foils 12 are wound into rolls.

In the thermocompression bonding step, first, the metal foils 12 fed from the metal foil rolls 32 are placed on both surfaces of the insulation film 11 fed from the insulation film roll 31 of the feeding unit 30 and continuously fed to the double belt press device 20. When the endless belts 23 and 24 rotate, the insulation film 11 and the metal foils 12 fed to the double belt press device 20 are transferred downstream in a state held between the endless belts 23 and 24.

When passing between the endless belts 23 and 24, the thermocompression device 25 applies a predetermined contact pressure to the insulation film 11 and the metal foils 12 through the endless belts 23 and 24. Simultaneously, the thermocompression device 25 heats the insulation film 11 and the metal foils 12 through the endless belts 23 and 24. This softens the insulation film 11 and thermocompression-bonds the insulation film 11 to the metal foil 12 to form the flexible laminated sheet 10, in which a metal layer is provided on each surface of an insulation layer. The flexible laminated sheet 10 transferred out of the double belt press device 20 is recovered and wound into a roll by the winding unit 40.

In the thermocompression bonding step, the insulation film 11 and the metal foils 12 are heated as described below. More specifically, at an upstream region (heating zone) between the endless belts 23 and 24, the insulation film 11 and the metal foils 12 are heated to a first temperature T1. At a downstream region (slow cooling zone) between the endless belts 23 and 24, the heat applied to the insulation film 11 and the metal foils 12 is reduced to slowly cool the insulation film 11 and the metal foils 12 so that the flexible laminated sheet 10 is transferred out of the double belt press device 20 at a second temperature T2 that is lower than the first temperature T1. In other words, the heating is performed so that the maximum temperature of the flexible laminated sheet 10 (insulation film 11 and metal foils 12) when passing between the endless belts 23 and 24 is the first temperature T1 and an exit temperature, which is the temperature of the flexible laminated sheet 10 when transferred out of the endless belts 23 and 24, is the second temperature T2. At a boundary portion between the heating zone and the slow cooling zone, the mode of heating is changed while maintaining a state in which the predetermined contact pressure is applied to the flexible laminated sheet 10 (insulation film 11 and metal foils 12).

When the melting point of the liquid crystal polymer of the insulation film 11 is expressed by mp, the first temperature T1 is in the range of "mp−45° C.≤T1≤mp−5° C." That is, the first temperature T1 is in the range from a temperature that is 45° C. lower than the melting point of the liquid crystal polymer to a temperature that is 5° C. lower than same melting point. For example, when the melting point of the liquid crystal polymer of the insulation film 11 is 335° C., the first temperature T1 is in the range of "290° C.≤T1≤330° C." The lower limit of the first temperature T1 expressed by "mp−45° C." is the minimum temperature required to sufficiently bond the insulation film 11 to the metal foils 12.

The upper limit of the first temperature T1 expressed by "mp−5° C." is the maximum temperature that limits the melting of the liquid crystal polymer of the insulation film 11. Once the liquid crystal polymer melts, the flow of the liquid crystal polymer disturbs the molecular orientation. This causes residual stress in the formed flexible laminated sheet 10. In this case, when the flexible laminated sheet 10 is heated again, large dimensional changes will occur. When the upper limit of the first temperature T1 is "mp−5° C." to restrict the melting and flow of the liquid crystal polymer, such a problem will seldom occur. This reduces the dimensional change rate of the flexible laminated sheet 10 between before and after the heating process is performed.

When the melting point of the liquid crystal polymer of the insulation film 11 is expressed by mp, the second temperature T2 is in the range of "mp−235° C.≤T2≤mp−100° C." That is, the second temperature T2 is in the range from a temperature that is 235° C. lower than the melting point of the liquid crystal polymer to a temperature that is 100° C. lower than same melting point. For example, when the melting point of the liquid crystal polymer of the insulation film 11 is 335° C., the second temperature T2 is in the range of "100° C.≤T2≤235° C." Slow cooling performed with the second temperature T2 in the above range decreases the influence of orientation changes caused by the flow of the liquid crystal polymer that occurs when the temperature reaches the first temperature T1. This reduces the dimensional change rate of the flexible laminated sheet 10 between before and after the heating process is performed.

The first temperature T1 can be checked by measuring the temperature of the flexible laminated sheet 10 when passing by a position in the thermocompression device 25 where the heating temperature turns to decrease. For example, in the thermocompression device 25 shown in FIG. 1, when the portions 25A and 25B serve as the heating zones that perform high-temperature heating to heat the flexible laminated sheet to the first temperature T1 and when the portions 25C and 25D serve as the slow cooling zones that perform low-temperature heating to heat the flexible laminated sheet to the second temperature T2, the first temperature T1 can be checked by measuring the temperature of the flexible laminated sheet 10 when passing by a position corresponding to the boundary between the portions 25B and 25C. The second temperature T2 can be checked by measuring the temperature of the flexible laminated sheet 10 immediately after transferred out of the endless belts 23 and 24.

It is preferred that the difference between the first temperature T1 and the second temperature T2, T1-T2, be in the range from 55° C. to 230° C. It is preferred that the ratio of the first temperature T1 and the second temperature T2, T1/T2, be in the range from 1.2 to 3.3.

The contact pressure applied to the insulation film 11 and the metal foils 12 when passing between the endless belts 23 and 24 is, for example, preferably in the range from 0.5 MPa to 6.0 MPa and more preferably in the range from 1.5 MPa to 5.0 MPa.

The flexible laminated sheet 10 manufactured through the above thermocompression bonding step has a small dimensional change rate. For example, the dimensional change rate is in the range of ±0.05% when the heating temperature is 250° C. in a dimensional stability test defined in Japanese Industrial Standards (JIS) C 6471-1995. Further, the flexible laminated sheet 10 has small thickness variation. For example, the standard deviation of thickness of the insulation layer is less than or equal to 1.2 µm in the widthwise direction of the insulation layer.

The flexible laminated sheet 10 obtained through the manufacturing method of the present embodiment is used for a flexible printed board and may be used as a tape used in a mounting technique such as the tape automated bonding (TAB) technique and the chip on film (COF) technique. Examples of the products having the flexible laminated sheet 10 include electric devices such as a camera, a personal computer, a liquid crystal display, a printer, and a mobile device.

The advantages of the present embodiment will now be described.

The method for manufacturing a flexible laminated sheet includes a step of continuously feeding an insulation film 11 formed of a liquid crystal polymer and metal foils 12 between a pair of endless belts 23 and 24 and a step of thermocompression-bonding the insulation film 11 to the metal foils 12 between the endless belts 23 and 24 to form a flexible laminated sheet 10.

The thermocompression bonding step includes heating the flexible laminated sheet 10 so that the maximum temperature (first temperature T1) of the flexible laminated sheet 10 is in the range from a temperature that is 45° C. lower than the melting point of the liquid crystal polymer of the insulation film 11 to a temperature that is 5° C. lower than the same melting point. The thermocompression bonding step also includes slowly cooling the flexible laminated sheet 10 so that an exit temperature (second temperature T2), which is a temperature of the flexible laminated sheet 10 when transferred out of the endless belts 23 and 24, is in the range from a temperature that is 235° C. lower than the melting point of the liquid crystal polymer of the insulation film 11 to a temperature that is 100° C. lower than the same melting point.

The above structure decreases the dimensional change rate of the flexible laminated sheet 10, in particular, the dimensional change rate between before and after the process of heating at 250° C. If the flexible laminated sheet 10 is used as a flexible printed board, the flexible laminated sheet 10 is exposed to a high temperature of approximately 250° C. when forming a conductor circuit or reflow-soldering to mount various elements. The reduction of dimensional changes in the flexible laminated sheet 10 is important from the viewpoint of high-density mounting. Thus, the flexible laminated sheet 10 in which the dimensional change rate between before and after the heating process performed at 250° C. is effective for a material of a flexible printed board used in high-density mounting.

The above embodiment may be modified as described below.

In the above embodiment, the metal foil 12 is thermocompression-bonded onto each surface of the insulation film 11. However, the metal foil 12 may be thermocompression-bonded onto only one surface of the insulation film to form a flexible laminated sheet 10 in which a metal layer is provided on one surface of an insulation layer.

Figure 2:
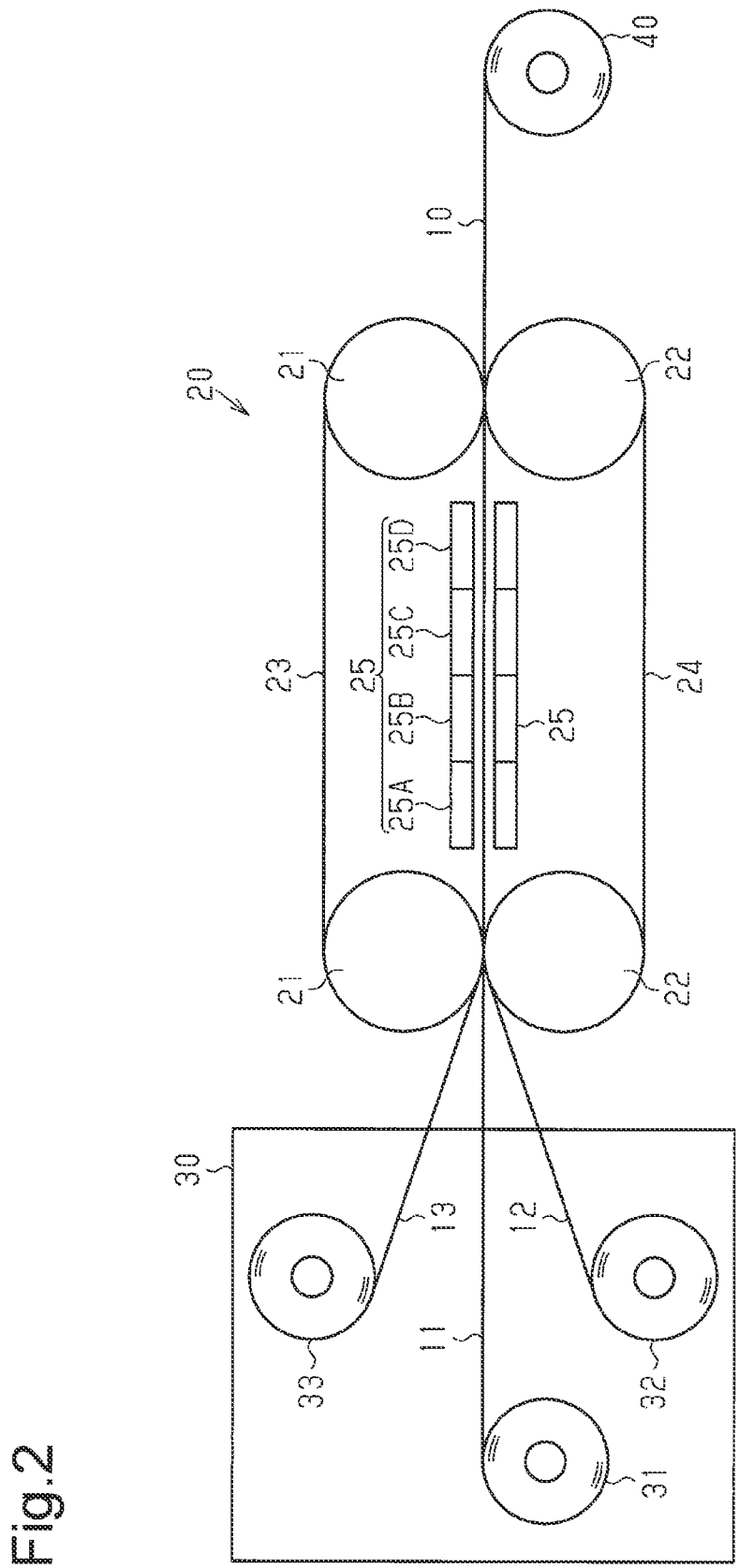
FIG. 2 is a schematic view showing a thermocompression bonding step of a modified embodiment.

In this case, for example, as shown in FIG. 2, the feeding unit 30 may include a release film roll 33 on which an elongated release film 13 is wound into a roll. The metal foil 12 fed from the metal foil roll 32 may be placed on one surface of the insulation film 11, which is fed from the insulation film roll 31 of the feeding unit 30. The release film 13 fed from the release film roll 33 may be placed on the opposite surface of the insulation film 11. The insulation film 11, the metal foil 12, and the release film 13 may be continuously fed to the double belt press device 20. The flexible laminated sheet 10 transferred out of the double belt press device 20 is recovered and wound into a roll by the winding unit 40 with the release film 13 on the flexible laminated sheet 10. The heating and pressing conditions for thermocompression-bonding the insulation film 11 to the metal foil 12 may be the same as the above embodiment.

The release film 13 limits the transfer of the softened insulation film 11 to the double belt press device 20 during the thermocompression bonding. A known release film used to manufacture a flexible laminated sheet may be used as the release film 13. In particular, a release film is preferably used that is formed of a material excellent in heat resistance, releasability, and flexiblitlue and, for example, at least one selected from heat-resistant aromatic polyimide, fluorine resin, and silicone resin that are not thermocompression bondable.

The release film 13 is removed when the flexible laminated sheet 10 is used. A recovery roll that recovers the release film 13 may be arranged in the winding unit 40 to remove the release film 13 from the flexible laminated sheet 10 and separately recover the flexible laminated sheet 10 and the release film 13 when transferred out of the double belt press device 20.

Next, the above embodiment will be described below in detail using examples and comparative examples.

Examples 101 to 113 and Comparative Examples 101 to 112

A double belt press device was used to manufacture flexible laminated sheets in each of which a metal layer is provided on each surface or one surface of an insulation layer. The quality of each of the obtained flexible laminated sheets was evaluated. Tables 1 and 2 show heating conditions of thermocompression bonding steps in examples 101 to 113 and comparative examples 101 to 112. That is, in examples 101 to 113, the first temperature T1 is in the range of "mp−45° C.<T1<mp−5° C." (290° C.<T1<330° C.), and the second temperature T2 is in the range of "mp−235° C.<T2<mp−100° C." (100° C.<T2<235° C.). In comparative examples 101 to 112, one of the first temperature T1 and the second temperature T2 falls outside the above ranges.

The conditions of the manufacturing other than the heating conditions are as follows.

Metal foil: rolled copper foil (made by JX Nikko Nisseki Co., Ltd., BHYX-92-HA).

Insulation film: LCP film (made by Kuraray Co., Ltd., Vecstar CTZ, melting point of 335° C.)

Release film: polyimide film (Ube Industries, Ltd., Upilex S, thickness of 25 µm). The release film was separated from the flexible laminated sheet after the thermocompression bonding step.

Pressure: 4.0 MPa.

The thicknesses of the metal foil and the insulation film that were used are shown in Tables 1 and 2.

Evaluation of Dimensional Change Rate

The dimensional change rate of each of the flexible laminated sheets when heated at the temperatures of 150° C. and 250° C. was measured in compliance with a dimensional stability test defined in Japanese Industrial Standards (JIS) C 6471. The results are shown in Tables 1 and 2. In Tables 1 and 2, MD stands for machine direction, that is, a longitudinal direction when continuously manufacturing the flexible laminated sheet, and TD stands for transverse direction, that is, the direction perpendicular to the longitudinal direction when continuously manufacturing the flexible laminated sheet.

Evaluation of Thickness Variation

A sample of 50 mm×520 mm width was collected from the flexible laminated sheet of each of examples 101 to 113 and comparative examples 101 to 112, and the metal layer was removed from this sample through an etching process. The thickness of the remaining insulation layer was measured with an intermittent thickness meter at fifty-two points at 10 mm intervals in the widthwise direction, and the standard deviation was calculated. The results are shown in Tables 1 and 2.

Evaluation of Peel Strength

The peel strength of the metal layer of the flexible laminated sheet of each of examples 101 to 113 and comparative examples 101 to 112 was measured in compliance with a peel strength test of copper foil defined in Japanese Industrial Standards (JIS) C 6471. The results are shown in Tables 1 and 2.

TABLE 1

| | | | | Example 101 | Example 102 | Example 103 | Example 104 | Example 105 | Example 106 | Example 107 | Example 108 |
|---|---|---|---|---|---|---|---|---|---|---|---|
| Materials | Metal Foil (μm) | | | 12 | 12 | 12 | 12 | 12 | 12 | 12 | 12 |
| | Insulation Film (μm) | | | 50 | 50 | 50 | 50 | 50 | 50 | 50 | 50 |
| | Metal Foil (μm) | | | 12 | 12 | 12 | 12 | 12 | 12 | 12 | 12 |
| Heating Conditions | First Temperature T1 (° C.) | | | 290 | 290 | 300 | 300 | 310 | 310 | 320 | 320 |
| | Melting Point Minus T1 (° C.) | | | 45 | 45 | 35 | 35 | 25 | 25 | 15 | 15 |
| | Second Temperature T2 (° C.) | | | 100 | 235 | 100 | 235 | 100 | 235 | 100 | 235 |
| | Melting Point Minus T2 (° C.) | | | 235 | 100 | 235 | 100 | 235 | 100 | 235 | 100 |
| Evaluations | Availability of Continuous Operation | | | Yes | Yes | Yes | Yes | Yes | Yes | Yes | Yes |
| | Dimensional Change Ratio | 150° C. | MD (%) | 0.00 | −0.01 | 0.00 | −0.01 | 0.00 | −0.02 | 0.00 | −0.01 |
| | | | TD (%) | 0.02 | 0.02 | 0.01 | 0.02 | 0.02 | 0.02 | 0.02 | 0.02 |
| | | 250° C. | MD (%) | −0.02 | −0.01 | −0.02 | 0.00 | −0.02 | 0.00 | 0.00 | 0.00 |
| | | | TD (%) | 0.01 | 0.02 | 0.01 | 0.03 | 0.02 | 0.03 | 0.02 | 0.03 |
| | Thickness Variation (μm) | | | 0.97 | 1.01 | 0.96 | 0.99 | 0.95 | 0.97 | 1.04 | 1.06 |
| | Peel Strength (N/mm) | | | 0.6 | 0.7 | 0.7 | 0.7 | 0.7 | 0.7 | 0.8 | 0.8 |

| | | | | Example 109 | Example 110 | Example 111 | Example 112 | Example 113 |
|---|---|---|---|---|---|---|---|---|
| Materials | Metal Foil (μm) | | | 12 | 12 | 12 | 12 | 12 |
| | Insulation Film (μm) | | | 50 | 50 | 25 | 100 | 50 |
| | Metal Foil (μm) | | | 12 | 12 | 12 | 12 | — |
| Heating Conditions | First Temperature T1 (° C.) | | | 330 | 330 | 320 | 320 | 320 |
| | Melting Point Minus T1 (° C.) | | | 5 | 5 | 15 | 15 | 15 |
| | Second Temperature T2 (° C.) | | | 100 | 235 | 100 | 100 | 100 |
| | Melting Point Minus T2 (° C.) | | | 235 | 100 | 235 | 235 | 235 |
| Evaluations | Availability of Continuous Operation | | | Yes | Yes | Yes | Yes | Yes |
| | Dimensional Change Ratio | 150° C. | MD (%) | 0.01 | −0.01 | 0.00 | 0.01 | 0.00 |
| | | | TD (%) | 0.02 | 0.02 | 0.03 | 0.04 | 0.01 |
| | | 250° C. | MD (%) | 0.00 | 0.01 | −0.01 | 0.00 | −0.02 |
| | | | TD (%) | 0.02 | 0.04 | 0.04 | 0.02 | 0.02 |
| | Thickness Variation (μm) | | | 1.09 | 1.08 | 1.01 | 1.13 | 1.01 |
| | Peel Strength (N/mm) | | | 0.9 | 1.0 | 0.8 | 0.7 | 0.8 |

TABLE 2

|  |  | Comparative Example 101 | Comparative Example 102 | Comparative Example 103 | Comparative Example 104 | Comparative Example 105 | Comparative Example 106 | Comparative Example 107 | Comparative Example 108 |
|---|---|---|---|---|---|---|---|---|---|
| Materials | Metal Foil (μm) | 12 | 12 | 12 | 12 | 12 | 12 | 12 | 12 |
|  | Insulation Film (μm) | 50 | 50 | 50 | 50 | 50 | 50 | 50 | 50 |
|  | Metal Foil (μm) | 12 | 12 | 12 | 12 | 12 | 12 | 12 | 12 |
| Heating Conditions | First Temperature $T_1$ (° C.) | 290 | 290 | 300 | 300 | 310 | 310 | 320 | 320 |
|  | Melting Point Minus $T_1$ (° C.) | 45 | 45 | 35 | 35 | 25 | 25 | 15 | 15 |
|  | Second Temperature $T_2$ (° C.) | 90 | 245 | 90 | 245 | 90 | 245 | 90 | 245 |
|  | Melting Point Minus $T_2$ (° C.) | 245 | 90 | 245 | 90 | 245 | 90 | 245 | 90 |
| Evaluations | Availability of Continuous Operation | No | Yes | No | Yes | No | Yes | No | Yes |
|  | Dimensional Change Ratio 150° C. MD (%) | — | 0.00 | — | 0.00 | — | 0.00 | — | 0.00 |
|  | 150° C. TD (%) | — | 0.05 | — | 0.05 | — | 0.05 | — | 0.07 |
|  | 250° C. MD (%) | — | 0.02 | — | 0.02 | — | 0.03 | — | 0.02 |
|  | 250° C. TD (%) | — | 0.06 | — | 0.06 | — | 0.06 | — | 0.08 |
|  | Thickness Variation (μm) | — | 0.97 | — | 0.95 | — | 1.03 | — | 1.1 |
|  | Peel Strength (N/mm) | — | 0.7 | — | 0.7 | — | 0.8 | — | 0.9 |

|  |  | Comparative Example 109 | Comparative Example 110 | Comparative Example 111 | Comparative Example 112 |
|---|---|---|---|---|---|
| Materials | Metal Foil (μm) | 12 | 12 | 12 | 12 |
|  | Insulation Film (μm) | 50 | 50 | 50 | 50 |
|  | Metal Foil (μm) | 12 | 12 | 12 | 12 |
| Heating Conditions | First Temperature $T_1$ (° C.) | 330 | 330 | 335 | 355 |
|  | Melting Point Minus $T_1$ (° C.) | 5 | 5 | 0 | −20 |
|  | Second Temperature $T_2$ (° C.) | 90 | 245 | 100 | 100 |
|  | Melting Point Minus $T_2$ (° C.) | 245 | 90 | 235 | 235 |
| Evaluations | Availability of Continuous Operation | No | Yes | Yes | Yes |
|  | Dimensional Change Ratio 150° C. MD (%) | — | 0.00 | 0.00 | 0.02 |
|  | 150° C. TD (%) | — | 0.07 | 0.05 | 0.07 |
|  | 250° C. MD (%) | — | −0.03 | −0.15 | −0.21 |
|  | 250° C. TD (%) | — | 0.12 | 0.22 | 0.28 |
|  | Thickness Variation (μm) | — | 1.1 | 1.25 | 2.4 |
|  | Peel Strength (N/mm) | — | 1.0 | 1.0 | 1.1 |

First, as shown in the column indicated as availability of continuous operation in Table 2, in each of comparative examples 101, 103, 105, 107, and 109, in which the second temperature $T_2$ was lower than "mp−235° C." (100° C.), a defect occurred in the rotation of the double belt press device when a flexible laminated sheet having a predetermined length was manufactured. Thus, the double belt press device could not be continuously operated. Accordingly, it was assumed that these flexible laminated sheets had extremely low mass productivity. Therefore, the dimensional change rate, the thickness variation, and the peel strength were not evaluated. Such a problem did not occur in the other examples and comparative examples in which the temperature $T_2$ was greater than or equal to "mp−235° C." (100° C.)

A comparison of the results between examples 102, 104, 106, 108, and 110 and comparative examples 102, 104, 106, 108, and 110 shows that the dimensional change rate in each of the tests of 150° C. and 250° C. was at least two times greater when the second temperature $T_2$ was "mp−100° C." (235° C.) or greater.

A comparison of the results between example 101 and comparative examples 111 and 112 shows that the dimensional change rate in each of the tests of 150° C. and 250° C. was at least two times greater when the first temperature $T_1$ was "mp−5° C." (330° C.) or greater.

As shown in Table 1, in each of examples 101 to 113, the thickness variation was a small value of less than or equal to 1.2 µm and the peel strength was a high value of 0.6 N/m or greater.

These results confirm that when the first temperature T1 and the second temperature T2 were in the above ranges, the dimensional change rate between before and after heating at 250° C. were decreased while ensuring the quality such as thickness variation and peel strength. These results also confirm that no problem occurred in terms of mass productivity of the flexible laminated sheets. Such advantageous effects were the same when the thickness of the insulation film was changed (examples 111 and 112) and when the flexible laminated sheet in which only one metal layer was provided was used (example 113). Although the detail data is not shown, similar results were obtained when using an electrolytic copper foil having a thickness of 12 µm (made by Mitsui Mining & Smelting Co., Ltd., 3EC-VLP) as the metal foil and when using other LCP films (made by Primatec Inc., BIAC-BC, melting point of 315° C., thickness of 50 µm) as the insulation film.

Second Embodiment

One embodiment of a laminated sheet manufacturing method of the present invention will now be described in detail.

A method for manufacturing a laminated sheet of the present embodiment includes a drying step of drying an insulation film and a thermocompression bonding step of thermocompression-bonding a metal foil onto the insulation film after the drying step. The laminated sheet is manufactured through the drying step and the thermocompression bonding step.

First, the insulation film and the metal foil used for manufacturing the laminated sheet will be described.

The insulation film forms an insulation layer of the laminated sheet. An insulation film formed of a polymer of 6-hydroxy-2-naphthoic acid and 4-hydroxybenzoic acid (hereinafter referred to as type II liquid crystal polymer) is used as the insulation film. The melting point of the type II liquid crystal polymer is preferably in the range from 280° C. to 360° C. and more preferably in the range from 300° C. to 345° C.

The thickness of the insulation film is not particularly limited. However, the thickness of the insulation film 11 is preferably in the range from 5 µm to 200 µm, more preferably in the range from 12 µm to 150 µm, and further preferably in the range from 25 µm to 100 µm.

The metal foil forms a metal layer of the laminated sheet. A metal foil such as a copper foil, an aluminum foil, a stainless steel foil, and a foil formed of an alloy of copper and aluminum can be used as the metal foil. In particular, it is preferred that at least one selected from a rolled copper foil, an electrolytic copper foil, and an aluminum foil be used as the metal foil. The thickness of the metal foil is not particularly limited. However, the thickness of the metal foil is preferably in the range from 3 µm to 40 µm, more preferably in the range from 3 µm to 35 µm, and further preferably in the range from 8 µm to 35 µm.

Next, the drying step of the manufacturing method of the present embodiment will be described.

The drying step is a step of drying the insulation film to remove moisture contained in the insulation film. In the drying step, the insulation film is heated with a drying device by exposing the insulation film to a particular temperature environment for a particular time.

The temperature (drying temperature) of the drying step is in the range from 120° C. to 250° C. and preferably in the range from 150° C. to 220° C. When the drying temperature is less than 120° C., the moisture contained in the insulation film may not be sufficiently removed. When the drying temperature exceeds 250° C., the liquid crystal polymer of the insulation film may be softened.

The time (drying time) of the drying step is greater than or equal to 20 seconds. When the drying time is less than 20 seconds, the moisture contained in the insulation film may not be sufficiently removed. Although the upper limit of the drying time is not particularly limited, it is preferred that the drying time be, for example, less than or equal to 600 seconds taking the production efficiency into account.

The drying device used in the drying step is not particularly limited as long as the above conditions are satisfied. Examples of the drying device include an infrared heater, an air heating furnace, an electric furnace, and a dielectric heating roller.

The drying step may be continuously performed for the insulation film that is continuously fed from, for example, a film roll or performed in batches every predetermined unit.

Next, the thermocompression bonding step of the manufacturing method of the present embodiment will be described.

The thermocompression bonding step is a step of forming the laminated sheet by thermocompression-bonding the metal foil onto the dried insulation film after the drying step. In the thermocompression bonding step, a heating and pressing device is used to heat the insulation film and the metal foil and apply a predetermined pressure to the insulation film and the metal foil in a state in which the metal foil is placed on one surface or each surface of the insulation film.

The insulation film under a high temperature immediately after the drying step may be used as is for the thermocompression bonding step. Alternatively, the insulation film after the drying step may be used for the thermocompression bonding step after the temperature of the insulation film is decreased to a predetermined temperature (for example, room temperature). However, when the insulation film whose temperature has been decreased is used, it is preferred that the insulation film after the drying step be cooled and stored in a dehumidified environment so that the moisture is not absorbed.

In the thermocompression bonding step, the insulation film and the metal foil are heated to a temperature in the range from 250° C. to 330° C. and preferably in the range from 300° C. to 320° C. When the heating temperature is less than 250° C., the insulation film and the metal foil may not be sufficiently bonded. When the heating temperature exceeds 330° C., the crystal structure of the liquid crystal polymer of the insulation film may be broken, which causes a decrease in the viscoelasticity of the insulation film.

In the thermocompression bonding step, the pressure applied to the insulation film and the metal foil is in the range from 0.5 MPa to 10 MPa and preferably in the range from 2 MPa to 6 MPa. When the pressure is less than 0.5 MPa, the insulation film and the metal foil may not be sufficiently bonded. The pressure exceeding 10 MPa is excessive for bonding the insulation film and the metal foil, which decreases the productivity.

The heating and pressing time in the thermocompression bonding step is in the range from 10 seconds to 600 seconds and preferably in the range from 30 seconds to 500 seconds. When the heating and pressing time is less than 10 seconds, the insulation film and the metal foil may not be sufficiently bonded. The heating and pressing time exceeding 600 seconds is excessive for bonding the insulation film and the metal foil, which decreases the productivity.

The heating and pressing device used for the thermocompression bonding step is not particularly limited as long as the above conditions are satisfied. Examples of the heating and pressing device include a heat press, a vacuum batch press, a multi-stage press, and a heating roll press, each of which has a flat heating and pressing unit. Examples of the heating and pressing device also include a double belt press device that performs heating and pressing between belts.

The thermocompression bonding step may be continuously performed for the insulation film and the metal foil that are continuously fed from, for example, film rolls or performed in batches every predetermined unit.

The laminated sheet manufactured through the manufacturing method of the present embodiment is used as a material for manufacturing a multilayer circuit board. That is, a pattern film is formed by forming a circuit on the metal layer portion of the laminated sheet. A via hole is formed in the insulation layer portion of the pattern film and filled with an interlayer connection material. A plurality of pattern films thus formed from the laminated sheet are laminated together and integrally bonded through a heating press into a multilayer. As a result, a multilayer circuit board is obtained.

A known manufacturing method (for example, manufacturing method disclosed in patent document 2) can be used for manufacturing the multilayer circuit board. However, it is preferred that the heating temperature of the heating press be in the range from 250° C. to 330° C. Further, it is preferred that the pressure of the heating press be in the range from 1 MPa to 10 MPa.

The laminated sheet manufactured through the manufacturing method of the present embodiment has a small dynamic thermal deformation amount at the insulation layer portion formed of the insulation film. For example, the maximum deformation rate is less than or equal to 0.85% at 250° C. to 300° C. when measured with a dynamic viscoelasticity measurement device under the conditions in which the dynamic load is 15 g, the frequency is 1 Hz, and the rate of temperature increase is 5° C./min while controlling the dynamic stress and the static load in a dynamic stress mode and an automatic static load mode.

In the manufacturing method of the present embodiment, the thermocompression bonding step is performed with the dried insulation film after the drying step. Thus, the manufactured laminated sheet has a small amount of moisture contained in the type II liquid crystal polymer of the insulation layer. As a result, it is assumed that a laminated sheet having a small dynamic thermal deformation amount is obtained.

More specifically, the type II liquid crystal polymer has ester linkage. Thus, the type II liquid crystal polymer undergoes hydrolysis when heated with water. A low-molecular-weight type II liquid crystal polymer generated through the hydrolysis has a tendency to flow. Thus, the generation of the low-molecular-weight type II liquid crystal polymer increases the dynamic thermal deformation amount at the insulation layer portion. The laminated sheet manufactured through the manufacturing method of the present embodiment has a small amount of moisture contained in the type II liquid crystal polymer of the insulation layer. This limits hydrolysis of the type II liquid crystal polymer when heated and limits decreases in molecular weight caused by the hydrolysis. As a result, it is assumed that a laminated sheet having a small dynamic thermal deformation amount at the insulation layer portion is obtained.

The laminated sheet manufactured through the manufacturing method of the present embodiment has a small dynamic thermal deformation amount at the insulation layer portion. This limits occurrence of large flow caused by the softening of the type II liquid crystal polymer of the insulation layer during heating press for manufacturing the multilayer circuit board. The flow of the type II liquid crystal polymer into the via hole is thus decreased. As a result, conduction failure between the layers of the multilayer circuit board is reduced.

The advantages of the present embodiment will now be described.

The laminated sheet formed by laminating an insulation film of a type II liquid crystal polymer and a metal foil together and used to manufacture a multilayer circuit board is manufactured through a drying step of drying the insulation film by heating the insulation film at a temperature of 120° C. to 250° C. for 20 seconds or longer and a thermocompression bonding step of thermocompression-bonding the dried insulation film onto the metal foil by pressing the dried insulation film and the metal foil against each other with a pressure of 0.5 MPa to 10 MPa for 10 seconds to 600 seconds while heating the dried insulation film and the metal foil at a temperature of 250° C. to 330° C.

The above structure allows for the manufacturing of a laminated sheet having a small dynamic thermal deformation amount in which the maximum deformation rate is less than or equal to 0.85% at 250° C. to 300° C. when measured with a dynamic viscoelasticity measurement device under the conditions in which the dynamic load is 15 g, the frequency is 1 Hz, and the rate of temperature increase is 5° C./min while controlling the dynamic stress and the static load in a dynamic stress mode and an automatic static load mode.

Next, the above embodiment will be described below in detail using examples and comparative examples.

Examples 201 to 205 and Comparative Examples 201 to 206

Laminated sheets were manufactured under different conditions of the drying step and the thermocompression bonding step. That is, when forming each laminated sheet, first, an insulation film fed from a film roll was continuously fed to a drying device, and the insulation film was dried by passing for a predetermined time through the drying device heated to a predetermined temperature (drying step). Then, metal foils fed from a pair of metal foil rolls were placed on both surfaces of the insulation film that had been passed through the drying device to be in a dried state, the metal foils were continuously fed to a double belt press device, and the double belt press device performed thermocompression bonding for the metal foils and the insulation film to obtain a laminated sheet (thermocompression bonding step).

Tables 3 and 4 show the conditions of the drying step (drying temperature and drying time) and the conditions of the thermocompression bonding step (heating temperature, pressure, and heating and pressing time) in examples 201 to 205 and comparative examples 201 to 206. The other manufacturing conditions are as follows.

Insulation film: type II liquid crystal polymer film (made by Kuraray Co., Ltd., Vecstar CTZ, melting point of 335° C.)

Metal foil: copper foil (made by Furukawa Electric Co., Ltd., F2-WS) or stainless steel foil (made by Toyo Seihaku Co., Ltd., SUS304H-TA)

Example 206

An insulation film cut out to a predetermined size was put into a drying device, and the insulation film was dried by applying to the insulation film a hot air having a predetermined temperature (drying step). Subsequently, a metal foil was placed on each surface of the dried insulation film, and the insulation film and the metal foils were thermocompression-bonded together by a heat press (thermocompression bonding step).

Evaluation of Dynamic Thermal Deformation Amount

The metal layers of both surfaces of the laminated sheet obtained in each of examples 201 to 206 and comparative examples 201 to 206 were removed through an etching process with a ferric chloride solution. A sample of 10 mm length×5 mm width was cut out from the remaining insulation film (insulation layer) and set to a dynamic viscoelasticity measurement device (made by UBM, Rheogel-E4000). The dynamic viscoelasticity measurement device set the dynamic load to 15 g and the frequency to 1 Hz in a dynamic stress control mode as a dynamic stress control method and in an automatic static load mode as a static load control method. The dynamic deformation amount of each sample was measured while increasing the temperature at a rate of 5° C./min. The column indicated as "dynamic thermal deformation amount" in Tables 3 and 4 shows the maximum value of the dynamic deformation amount in the longitudinal direction of each sample at 250° C. to 300° C. The column indicated as "maximum deformation rate" in Tables 3 and 4 shows, expressed as a percentage, a value obtained by dividing the maximum value of the dynamic deformation amount by the original length of the same sample (10 mm).

Evaluation of Adhesiveness

In compliance with a peel strength test of copper foil defined in Japanese Industrial Standards (JIS) C 6471, the peel strength of the metal layer of the flexible laminated sheet obtained in each of examples 201 to 206 and comparative examples 201 to 206 was measured, and the adhesiveness of the laminated sheet was evaluated based on the measurement values. The results are shown in Tables 3 and 4. The evaluation of adhesiveness was conducted on the basis that the peel strength that is greater than or equal to 0.3 N/m is "good" and the peel strength that is less than 0.3 N/m is "not acceptable."

Manufacturing of Multilayer Circuit Board

Pattern films were manufactured by preparing sets of laminated sheets that were the same as the laminated sheets of examples 201 to 206 and comparative examples 201 to 203 as described above, forming a circuit on one of two metal layers of each laminated sheet, and removing the other metal layer through an etching process. Via holes were formed in some of the pattern films formed from the same laminated sheets, and the via holes were filled with interlayer connection materials. A multilayer circuit board was obtained by laminating eight pattern films with via holes and one pattern film without a via hole among the pattern films formed from the same laminated sheets and by pressing the pattern films at 4 MP with a vacuum heating press while heating the pattern films to 280° C.

Evaluation of Conductivity

A liquid phase heat impact test (−40° C. to 125° C., 300 cycles) was conducted on the obtained multilayer circuit board, and circuit resistance values of the multilayer circuit board before and after the test were measured with a resistance measurement device. The change rate of the circuit resistance value before the liquid phase heat impact test to the circuit resistance value after the liquid phase heat impact test was calculated, and conductivity of the multilayer circuit board was evaluated based on the change rate. The evaluation of conductivity was conducted on the basis that the change rate of a resistance value that is less than 20% is "good" and the change rate of a resistance value that is greater than or equal to 20% is "not acceptable." Evaluation of conductivity is not shown in comparative examples 204 to 206 in which the evaluation of adhesiveness was not acceptable.

TABLE 3

| | | Example 201 | Example 202 | Example 203 | Example 204 | Example 205 | Example 206 |
|---|---|---|---|---|---|---|---|
| Manufacturing Conditions | Thickness of Insulation Film (μm) | 50 | 50 | 25 | 100 | 50 | 50 |
| | Type of Metal Foil | Copper Foil | Copper Foil | Copper Foil | Copper Foil | SUS Foil | Copper Foil |
| | Thickness of Metal Foil (μm) | 12 | 12 | 12 | 12 | 20 | 12 |
| | Drying Temperature (° C.) | 200 | 200 | 200 | 200 | 200 | 200 |
| | Drying Time (Sec) | 60 | 60 | 60 | 60 | 60 | 60 |
| | Heating Temperature (° C.) | 310 | 330 | 310 | 310 | 310 | 310 |
| | Pressure (MPa) | 4 | 4 | 4 | 4 | 4 | 2.5 |
| | Healing and Pressing Time (Sec) | 210 | 210 | 210 | 210 | 210 | 210 |
| Evaluations | Dynamic Thermal Deformation Amount (μm) | 70 | 80 | 70 | 70 | 70 | 74 |
| | Maximum Deformation Ratio (%) | 0.70 | 0.80 | 0.70 | 0.70 | 0.70 | 0.74 |
| | Adhesiveness | Good | Good | Good | Good | Good | Good |
| | Conductivity | Good | Good | Good | Good | Good | Good |

TABLE 4

| | | Comparative Example201 | Comparative Example202 | Comparative Example203 | Comparative Example204 | Comparative Example205 | Comparative Example206 |
|---|---|---|---|---|---|---|---|
| Manufacturing Conditions | Thickness of Insulation Film (μm) | 50 | 50 | 50 | 50 | 50 | 50 |
| | Type of Metal Foil | Copper Foil | Copper Foil | Copper Foil | Copper Foil | Copper Foil | Copper Foil |
| | Thickness of Metal Foil (μm) | 12 | 12 | 12 | 12 | 12 | 12 |
| | Drying Temperature (° C.) | 100 | 200 | 200 | 200 | 200 | 200 |
| | Drying Time (Sec) | 60 | 60 | 60 | 60 | 60 | 60 |
| | Heating Temperature (° C.) | 310 | 310 | 340 | 240 | 310 | 310 |

TABLE 4-continued

|  |  | Comparative Example201 | Comparative Example202 | Comparative Example203 | Comparative Example204 | Comparative Example205 | Comparative Example206 |
|---|---|---|---|---|---|---|---|
| Evaluations | Pressure (MPa) | 4 | 4 | 4 | 4 | 0.4 | 4 |
|  | Healing and Pressing Time (Sec) | 210 | 210 | 210 | 210 | 210 | 5 |
|  | Dynamic Thermal Deformation Amount (μm) | 88 | 87 | >90 | 70 | 70 | 70 |
|  | Maximum Deformation Ratio (%) | 0.88 | 0.87 | >0.90 | 0.70 | 0.70 | 0.70 |
|  | Adhesiveness | Good | Good | Good | Not Acceptable | Not Acceptable | Not Acceptable |
|  | Conductivity | Not Acceptable | Not Acceptable | Not Acceptable | — | — | — |

As shown in Tables 3 and 4, the evaluation of conductivity was "good" in examples 201 to 206 in which the dynamic heat deformation amount was less than or equal to 85 μm (maximum deformation rate was less than or equal to 0.85%), and the evaluation of conductivity was "not acceptable" in comparative examples 201 to 203 in which the dynamic heat deformation amount exceeded 85 μm (maximum deformation rate exceeded 0.85%). This result confirms that decreases in the dynamic thermal deformation amount (maximum deformation rate) limited conduction failure of the multilayer circuit board.

The result of comparative example 201 confirms that when the drying temperature in the drying step was lower than the range from 120° C. to 250° C., the dynamic thermal deformation amount and the maximum deformation rate were large. The result of comparative example 202 confirms that when the drying time in the drying step was shorter than 20 seconds, the dynamic thermal deformation amount and the maximum deformation rate were large. The result of comparative example 3 confirms that when the heating temperature in the thermocompression bonding step was higher than the range from 250° C. to 330° C., the dynamic thermal deformation amount and the maximum deformation rate were large. These results confirm that the drying temperature and the drying time in the drying step and the heating temperature in the thermocompression bonding step are important to adjust the dynamic thermal deformation amount and the maximum deformation rate.

Further, the results of comparative examples 204 to 206 confirm that sufficient adhesiveness was not obtained when the heating temperature in the thermocompression bonding step was lower than the range from 250° C. to 330° C., when the pressure in the thermocompression bonding step was smaller than the range from 0.5 MPa to 10 MPa, and when the heating and pressing time in the thermocompression bonding step was shorter than the range from 10 seconds to 600 seconds. These results confirm that the heating temperature, the pressure, and the heating and pressing time in the thermocompression bonding step are important to ensure sufficient adhesiveness of the laminated sheet.

The embodiments and the modified embodiments may be combined or replaced. Further, the illustrated features may be combined.

The present invention is not limited to the illustrated features. For example, all the features of the disclosed particular embodiments should not be interpreted as essential for the present invention, and the subject matter of the present invention may exist in fewer features than all the features of the disclosed particular embodiments.

DESCRIPTION OF REFERENCE CHARACTERS

10 . . . flexible laminated sheet, 11 . . . insulation film, 12 . . . metal foil, 13 . . . release film, 20 . . . double belt press device, 21 . . . upper drum, 22 . . . lower drum, 23 and 24 . . . endless belts, 25 . . . thermocompression device, 30 . . . feeding unit, 31 . . . insulation film roll, 32 . . . metal foil roll, 33 . . . release film roll, 40 . . . winding unit.

The invention claimed is:

1. A method for manufacturing a flexible laminated sheet consisting of an insulation film formed of a liquid crystal polymer and a metal foil provided on one or both sides of the insulation film, the method comprising steps of:
    continuously feeding the insulation film and the metal foil between a pair of two endless belts; and
    thermocompression-bonding the insulation film onto the metal foil by applying heat and pressure to the insulation film and the metal foil between the endless belts to form a flexible laminated sheet, wherein
    the step of thermocompression bonding comprises:
    heating the flexible laminated sheet so that a maximum temperature of the flexible laminated sheet is in a range from a temperature that is 45° C. lower than a melting point of the liquid crystal polymer of the insulation film to a temperature that is 5° C. lower than the melting point, and
    cooling the flexible laminated sheet under the pressure between the endless belts so that an exit temperature, which is a temperature of the flexible laminated sheet when transferred out of the endless belts, is in a range from a temperature that is 235° C. lower than the melting point of the liquid crystal polymer of the insulation film to a temperature that is 100° C. lower than the melting point.

2. The method for manufacturing a flexible laminated sheet according to claim 1, wherein the insulation film is formed of a liquid crystal polymer containing as constituent units 6-hydroxy-2-naphthoic acid and para-hydroxybenzoic acid and having a melting point in excess of 250° C.

3. The method for manufacturing a flexible laminated sheet according to claim 1, wherein the metal foil is at least one selected from the group consisting of a copper foil, an aluminum foil, a stainless steel foil, and a foil formed of an alloy of copper and aluminum.

4. The method for manufacturing a flexible laminated sheet according to claim 2, wherein the metal foil is at least one selected from the group consisting of a copper foil, an aluminum foil, a stainless steel foil, and a foil formed of an alloy of copper and aluminum.

* * * * *